United States Patent
Sauer

(12) 
(10) Patent No.: US 6,442,046 B1
(45) Date of Patent: Aug. 27, 2002

(54) ELECTRONIC EQUIPMENT WITH CAVITY ISOLATOR

(75) Inventor: Scott B. Sauer, Rocklin, CA (US)

(73) Assignee: Powerwave Technologies, Inc., Santa Ana, CA (US)

(*) Notice: Subject to any disclaimer, the term of this patent is extended or adjusted under 35 U.S.C. 154(b) by 0 days.

(21) Appl. No.: 09/560,799

(22) Filed: Apr. 28, 2000

(51) Int. Cl.[7] .................................................. H05K 9/00
(52) U.S. Cl. ........................ 361/818; 361/800; 361/799; 174/35 MS; 174/32; 174/51; 439/607; 439/608; 439/609
(58) Field of Search .................................. 361/818, 816, 361/800, 799, 753; 174/51, 35 R, 35 MS, 32; 439/607, 608, 609, 610; 220/719, 4.02, 523, 500

(56) References Cited

U.S. PATENT DOCUMENTS 5,039,825 A * 8/1991 Samarov .................... 174/35 G
5,610,368 A   3/1997 Smith

* cited by examiner

Primary Examiner—David S. Martin
Assistant Examiner—Hung Bui
(74) Attorney, Agent, or Firm—Myers, Dawes & Andras LLP

(57) ABSTRACT

A apparatus and a method of isolating two cavities within an electrical equipment by using a S-shaped plate having fingers on opposite sides such that the S-shaped plate may be installed between two open ended inner walls.

15 Claims, 9 Drawing Sheets

ELECTRONIC EQUIPMENT WITH CAVITY ISOLATOR

BACKGROUND OF THE INVENTION

1. Field of Invention

The present invention is directed to a electronic equipment with an apparatus for isolating cavities. More specifically, preferred embodiments of the present invention provide an electrical equipment with an apparatus for electrically isolating cavities within the electrical equipment.

2. Description of Related Arts

For electronic equipment, such as a RF amplifier, components that emit or are susceptible to electromagnetic interference ("EMI") must be contained or shielded, respectively, within the electronic equipment. Often times the components within an electronic equipment are contained or shielded by being placed in an isolated cavity. FIG. 1 shows an example of a conventional apparatus for isolating a cavity within an electronic equipment. Specifically, FIG. 1 is a perspective view of a bulkhead plate 10 that includes an overhang support 11, alternating fingers 12 on the sides with dimplings 13, and spring fingers 14 on the bottom. FIG. 2 shows the bulkhead plate 10 installed onto a surface such as a printed circuit board 15 with open ended inner walls 16, wherein the bulkhead plate 10 is held in place by clipping the fingers 12 on the inner walls 16, and wherein the dimplings 13 on the fingers 12 apply additional resilient force against the open ended inner walls 16. The spring fingers 14 provide resilient support for the bulkhead plate 10, and partially compensate occasional irregularities on the lower surface 15. The fingers 12 and spring fingers 14 also serve as grounding paths, hence isolating the adjacent cavities from EMI. Typically, the spring fingers 14 are required to be about half as thin as the bulkhead plate 10. This is required because the spring fingers 14 must be sufficiently thin to be flexible and thus provide the spring-like qualities. Due the requirements that the spring fingers 14 be very thin, it is often necessary to chemically etch the spring fingers 14 in order to achieve the desired thinness.

FIGS. 1 and 3 of U.S. Pat. No. 5,610,368 show another example of a similar conventional apparatus for isolating a cavity within electrical circuitry. More specifically, bulkhead plate 1 includes an overhang support 4, fingers 3 with dimplings 6, and passthrough filters 2. The bulkhead plate 1 can be mounted within an enclosure 7 with a frame member 8. Electrical wires can passthrough the bulkhead plate 1 through filters 2, allowing the two adjacent compartments to maintain EMI isolation while still permitting electrical connections between the two compartments.

SUMMARY OF THE INVENTION

The preferred embodiments of the present invention include a cavity isolator that provides a grounding path from wall to wall and from lid to base of an enclosure such that the isolated cavities are shielded from each other's EMI emissions. More specifically, the preferred embodiments provide a S-shaped plate structure having fingers on opposite edges. The S-shaped plate structure can be vertically inserted between two cavities with the fingers applying loads to the inner support walls that separate the two cavities.

Advantages of the present invention include ease and cheap manufacturing, since it is not necessary to individually bend the fingers, and no etching of edges are necessary. The present invention also provides the advantage of permitting flexibility in the design of the actual S-shape, allowing the designer to vary the dimensions and curves with ease to match a variety of application requirements.

Additional advantages of the present invention include superior EMI isolation over the conventional bulkhead plates, ability to interface with the base and lid at a wide range of locations relative to the support walls, ability to control the interface between the fingers and the support walls, and improved grounding of the EMI emissions. The details of specific embodiments and their respective advantages will be further described below.

BRIEF DESCRIPTIONS OF THE DRAWINGS

DETAILED DESCRIPTION OF PREFERRED EMBODIMENTS

Preferred embodiments of the present invention will now be described with references to FIGS. 3 to 6.

Figure 3:
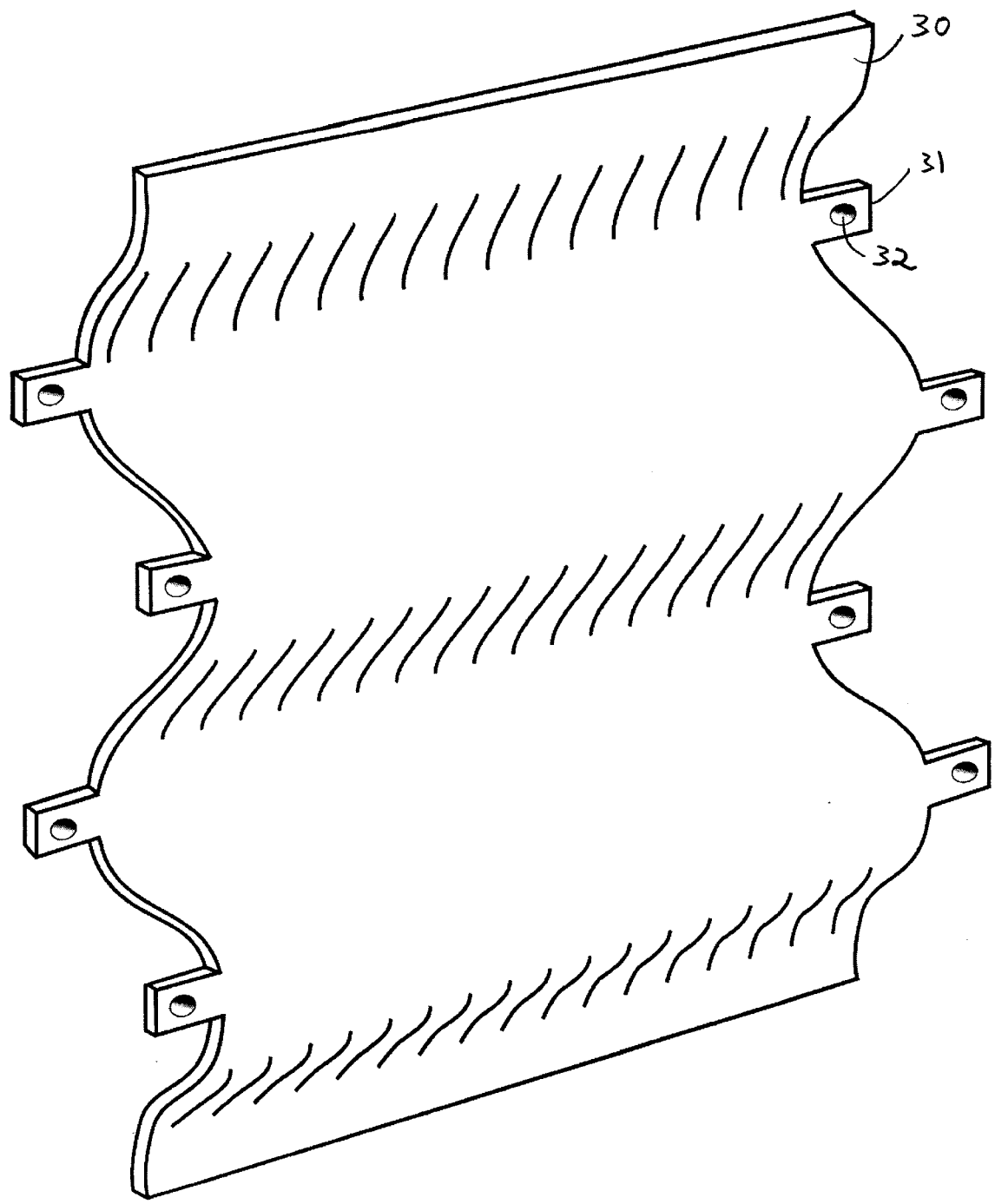
FIG. 3 is a perspective view of a preferred embodiment of the present invention.

FIG. 3 is a perspective view of a preferred embodiment of the present invention. As shown in FIG. 3, a S-shaped plate 30 includes fingers 31 on opposite edges of the plate, each finger preferably including dimplings 32. As a result of the curves, the S-shaped plate exhibits compressible characteristics in the vertical direction. While FIG. 3 shows the S-shaped plate 30 as having a basic configuration of four alternating curves, other embodiments of the present invention may include S-shaped plates with different numbers of curves. The compressible characteristics of the S-shaped plate 30 are affected by the number of curves as well as the shape of the curves on the S-shaped plate 30. More specifically, the resistant strength of the S-shaped plate 30 for a given force is increased with an increasing number of curves, and vice versa. At the same time, the resistant strength of the S-shaped plate 30 for a given number of curves is decreased when the radius of curvature of the curves are increased, and vice versa. A designer is free to control the number of curves as well as their radius of curvatures on the S-shaped plate 30 in order to achieve the desired compressible characteristics for a particular purpose. A designer is also free to control the thickness of the S-shaped plate 30 to achieve a desired resiliency. In general, the thicker the S-shaped plate 30, the more resistant it is to vertical compression force.

Figure 4:
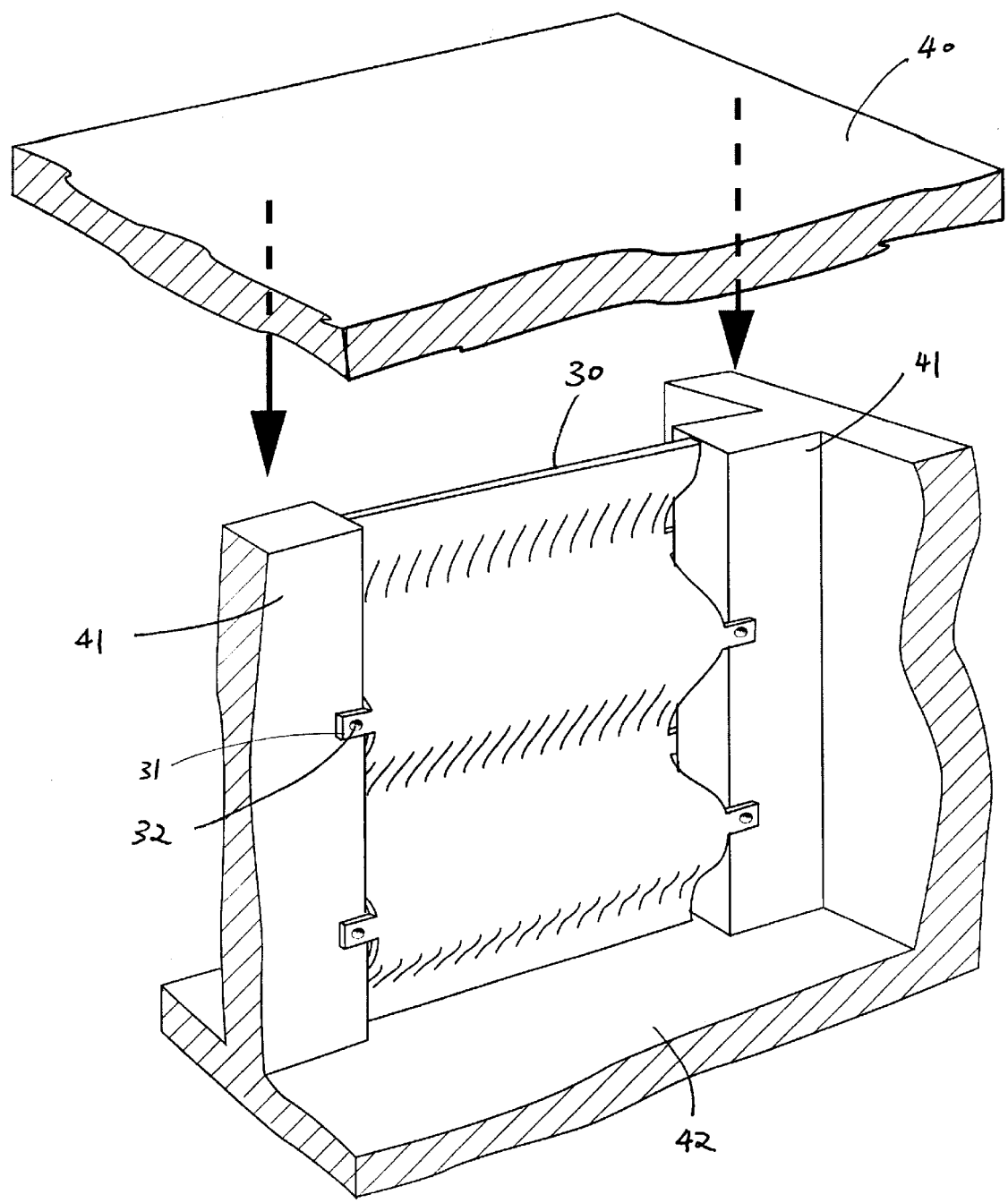
FIG. 4 is a perspective view of a preferred embodiment of the present invention installed between two cavities.
Figure 5:
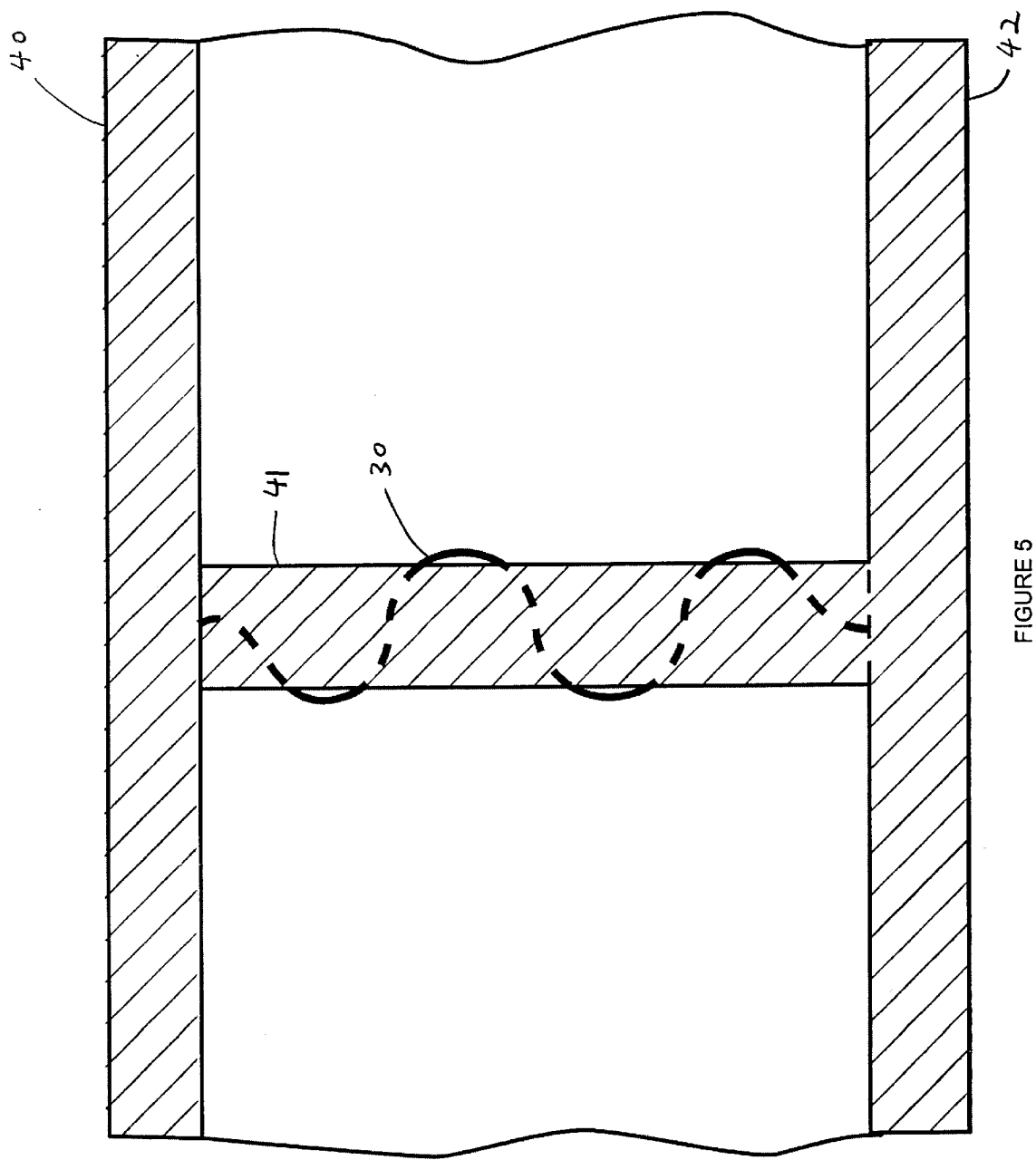
FIG. 5 is a side view of a preferred embodiment of the present invention installed between two cavities.

FIG. 4 is a perspective view of the preferred embodiment of FIG. 3 installed between two open ended inner walls 41, a lid 40, and a base 42, while FIG. 5 is a side view of the same. The S-shaped plate 30 is preferably slid down between the two open ended inner walls 41 such that the fingers 31 interface with the open ended inner walls 41 alternatively. The dimplings 32 add additional support to the S-shaped plate by securing the interfaces between the fingers 31 and the open ended inner walls 41. Although FIG. 4 shows the S-shaped plate 30 having a top edge flush with the top edges of the open ended inner walls 41, it is contemplated within the scope of the present invention that the S-shaped plate may have a top edge exceeding the top edges of open ended inner walls 41. In such a case, the top edge of the S-shaped plate 30 may be pressed down by the lid 40 such that the top edge of the S-shaped plate 30 is made flush with the top edges of the open ended inner walls 41. This would result in a stronger reactive force exerted by the S-shaped plate 30, ensuring a tighter vertical fit.

Figure 1:
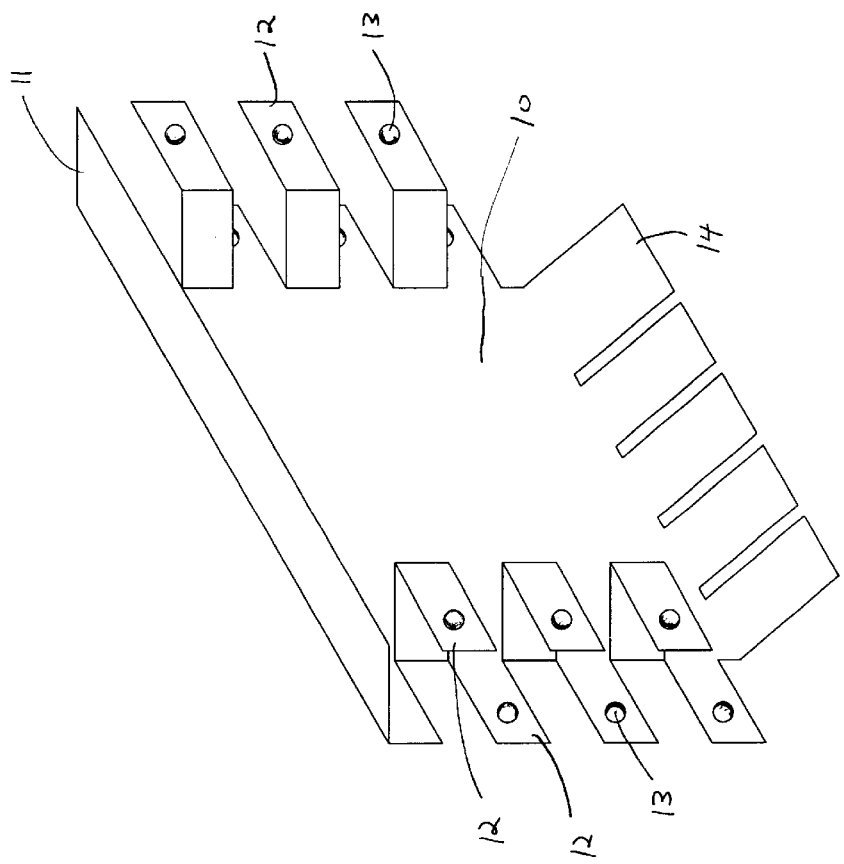
FIG. 1 is a perspective view of a conventional bulkhead plate cavity isolator.
Figure 2:
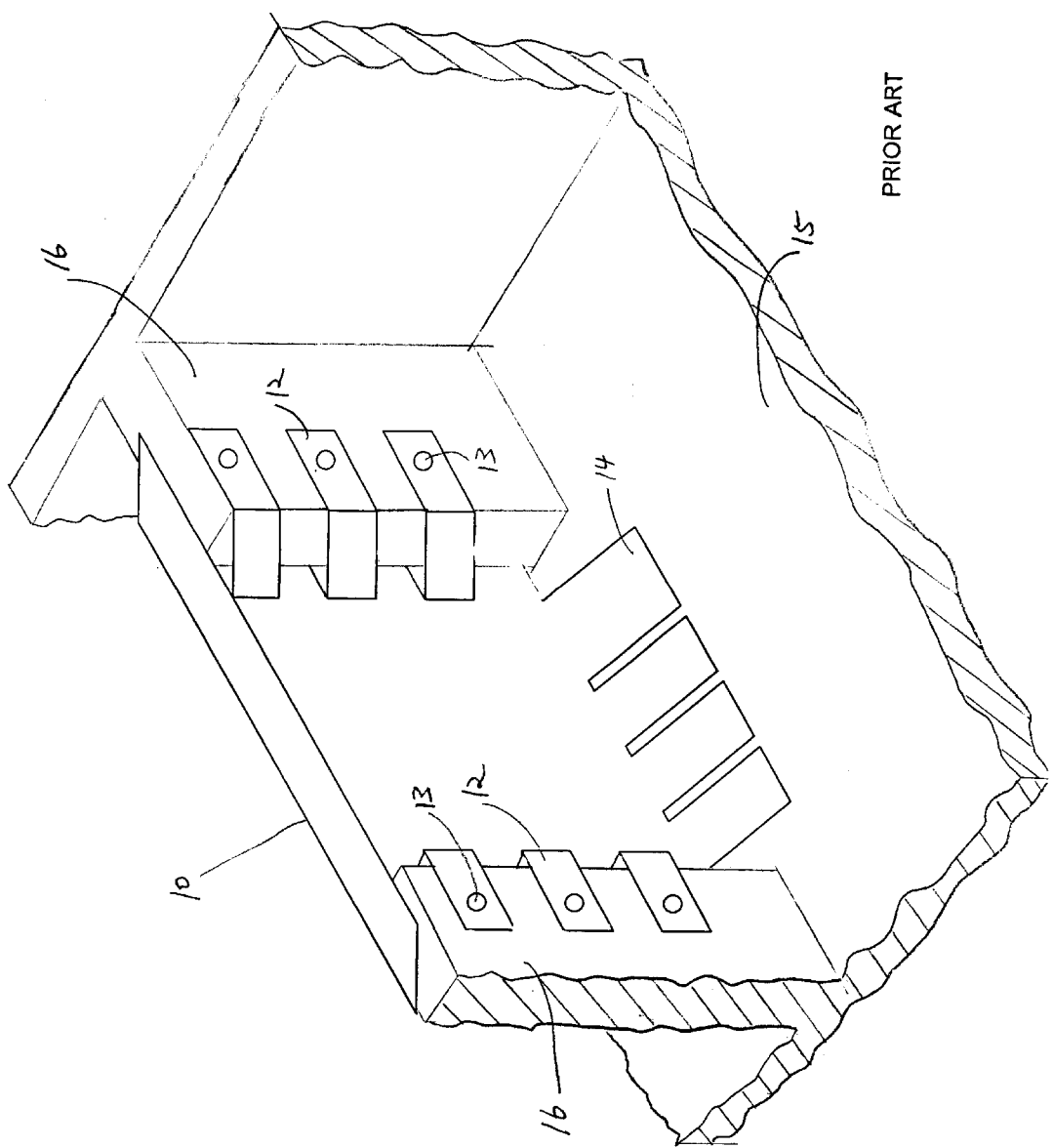
FIG. 2 is a perspective view of the conventional bulkhead plate in FIG. 1 installed between two support walls and a base plate.

Preferred embodiments of the present invention provides many advantages by achieving compressible qualities using S curves. First, because the preferred embodiments do not require spring fingers at the bottom to achieve compressible characteristics, the preferred embodiments provide a better electrical isolation between the two cavities. More specifically, because prior art apparatuses such as one shown in FIGS. 1 and 2 require spring fingers at the bottom to achieve compressible qualities, the openings between the spring fingers permit certain EMI waves to pass through, compromising the EMI isolation purpose of the isolator.

Second, because the preferred embodiments do not require offset spring fingers at the bottom, the fingers on the sides of the S-shaped plate experience uniform horizontal load. More specifically, because the prior art apparatuses such as one shown in FIGS. 1 and 2 require spring fingers 14 that bend to create resistive force, the ends of the fingers 12 may react to a torque that is created by exertion of force in a vertical direction. As a result of the torque created, the horizontal load against a set of fingers 12 on one side of the plate 10 increases, while the horizontal load against a set of fingers on the opposite side of the plate 10 decreases, thereby creating uneven horizontal loads on the fingers 12. By ensuring uniform horizontal load on the fingers 31, the S-shaped plate 30 allows uniform contact with the open ended inner walls 41 and thereby improves the grounding characteristics of the S-shaped plate 30.

Figure 6:
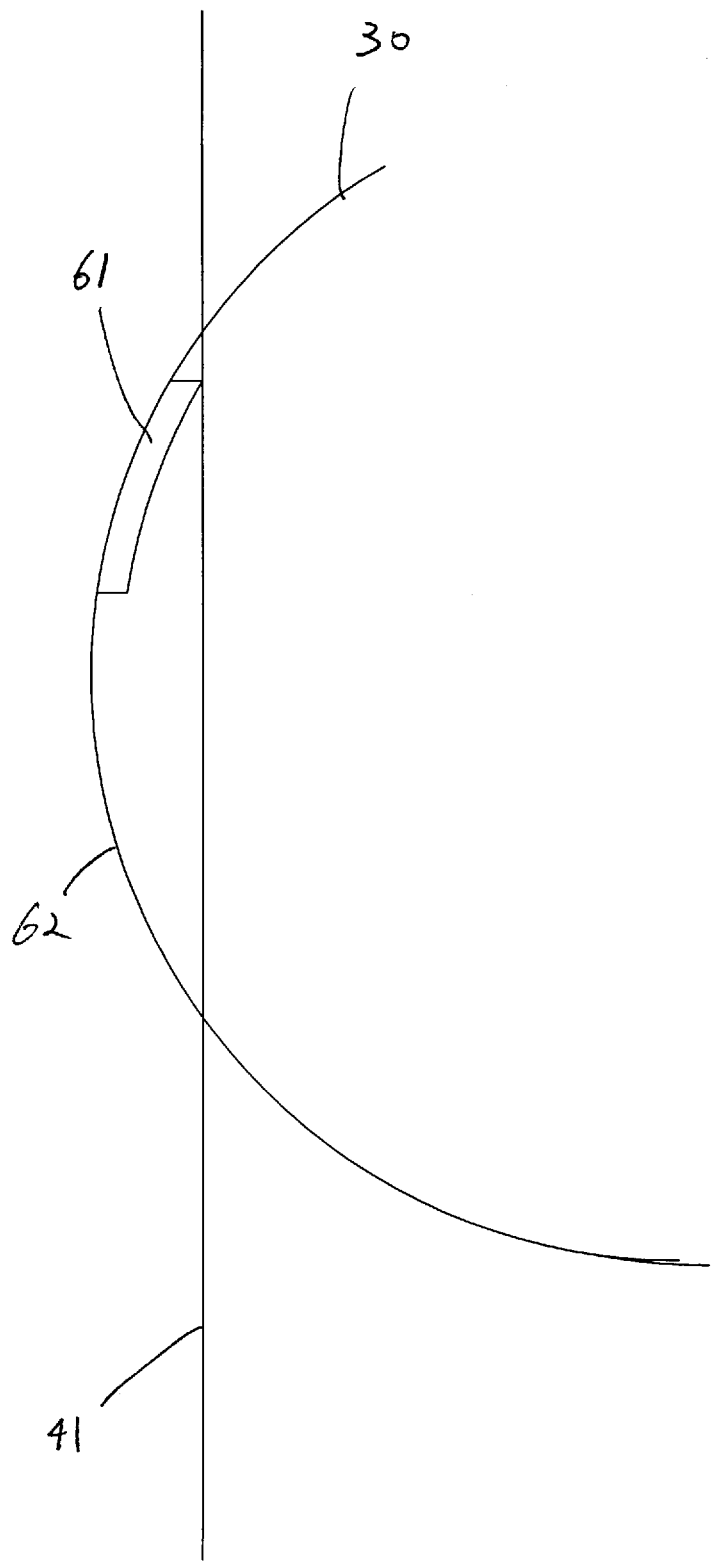
FIG. 6 is a side view of a portion of a preferred embodiment of the present invention.

FIG. 6 is a side view of one curve 62 of an alternative embodiment of the present invention. Specifically, a curve 62 of a S-shaped plate 30 is shown as having a lead element 61 attached at the underside of the curve 62. During the installation of the S-shaped plate 30, the S-shaped plate 30 is pushed downward along the open ended inner walls 41, whereby the lead element 61 preferably slides along the open ended inner walls 41. Once the S-shaped plate 30 is installed, removal of the S-shaped plate 30 will be met with resistance force as the top edge of the lead element 61 resiliently oppose any upward motion of the S-shaped plate 30. This alternative locking feature further ensures that the S-shaped plate 30 is securely installed between the open ended inner walls 41, and prevents any accidental dislodging of the S-shaped plate 30.

Figure 7:
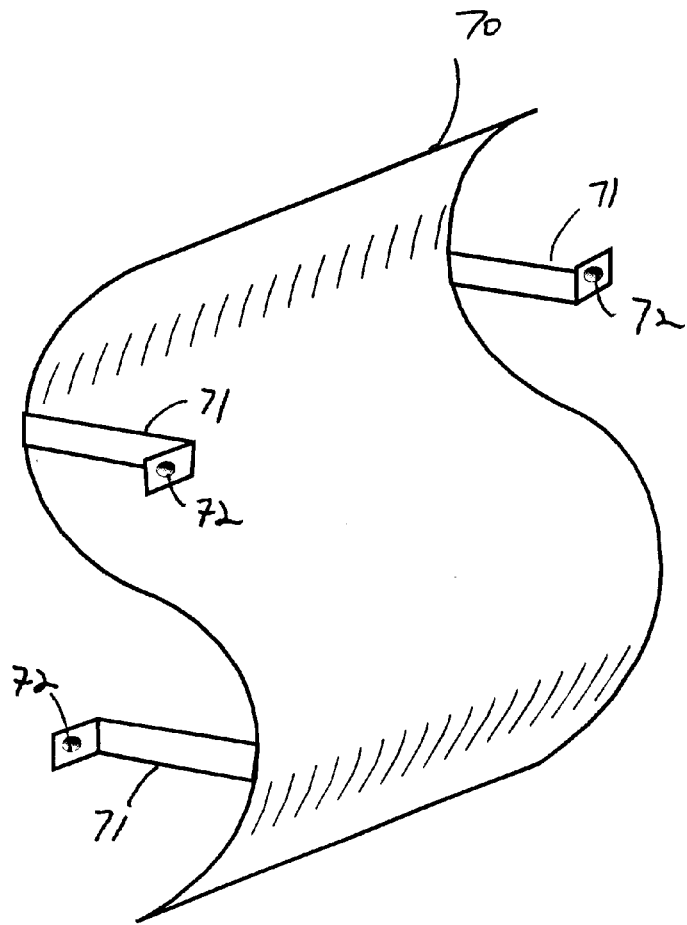
FIG. 7 is a perspective view illustrating a cavity isolator according to another embodiment of the present invention.

FIG. 7 is a perspective view illustrating a S cavity isolator according to another embodiment of the present invention. In this embodiment, the fingers 71 of the S-shaped plate 70 is extended away from the S-shaped plate 70 in a substantially perpendicular fashion as shown. Like previously discussed embodiments, the fingers 71 also include dimplings 72 to provide additional support to the S-shaped plate 70 by securing the interfaces between the fingers 71 and open ended inner walls. This embodiment of the present invention provides the additional advantage of allowing a designer to vary the length of fingers 71 to accommodate for various thickness of inner walls between which the S-shaped plate 70 may be installed.

Figure 8:
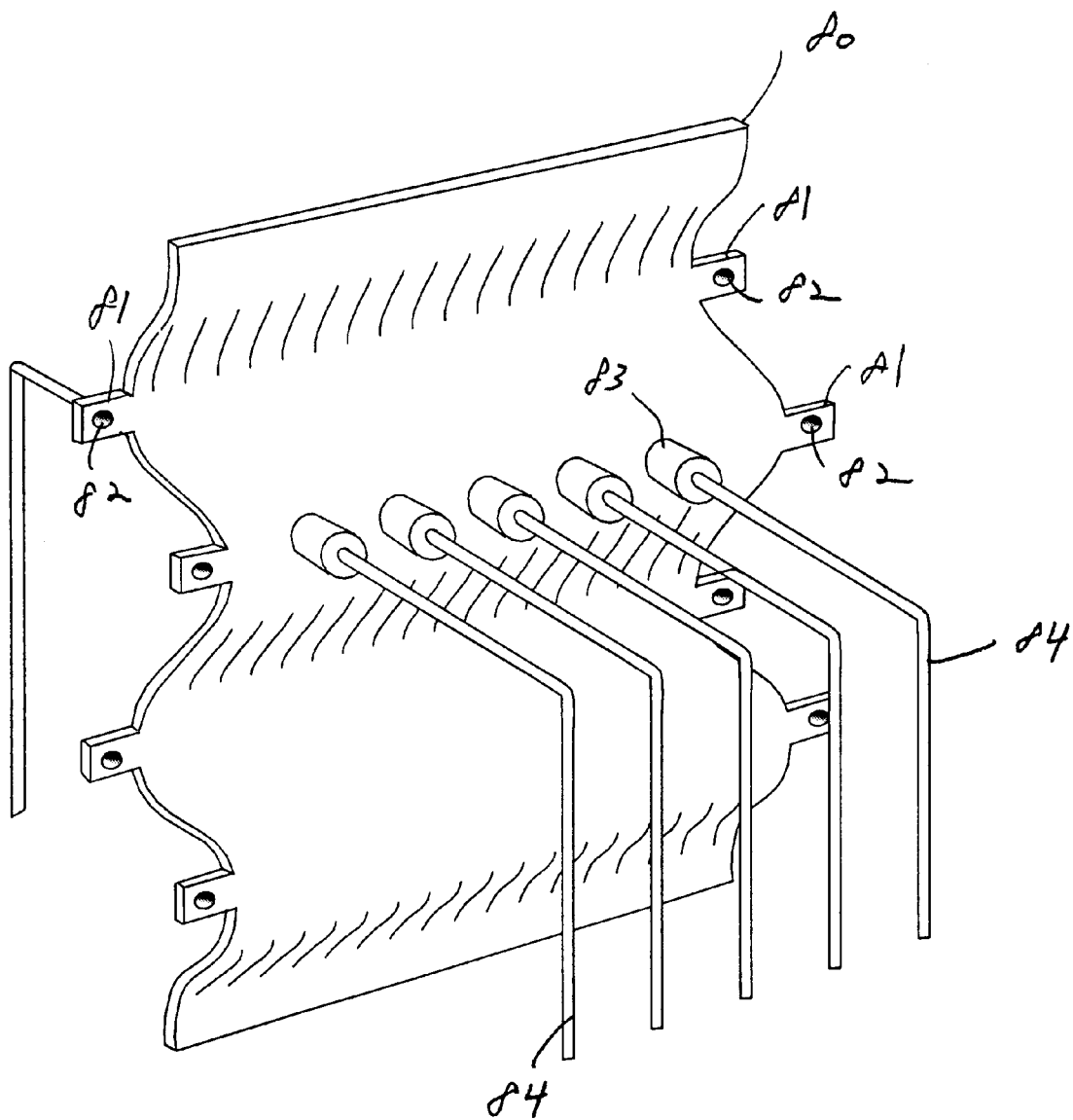
FIG. 8 is a perspective view of a cavity isolator according to another embodiment of the present invention.

FIG. 8 is a perspective view of a S cavity isolator according to another embodiment of the present invention. Specifically, FIG. 8 shows a S-shaped plate 80 having fingers 81, dimplings 82, passthrough conductive wires 84, and preferably EMI filters 83 adjoining the interface between the wires 84 and the S-shaped plate 80. The wires 84 passes through from one side of the S-shaped plate 80 to the other side, as shown in FIG. 8. The wires 84 may be connected to various electrical components on the opposite sides of the S-shaped plate 80, thereby facilitating electrical signals to transmit between the components on both sides while still providing EMI shielding to both sides.

Figure 9:
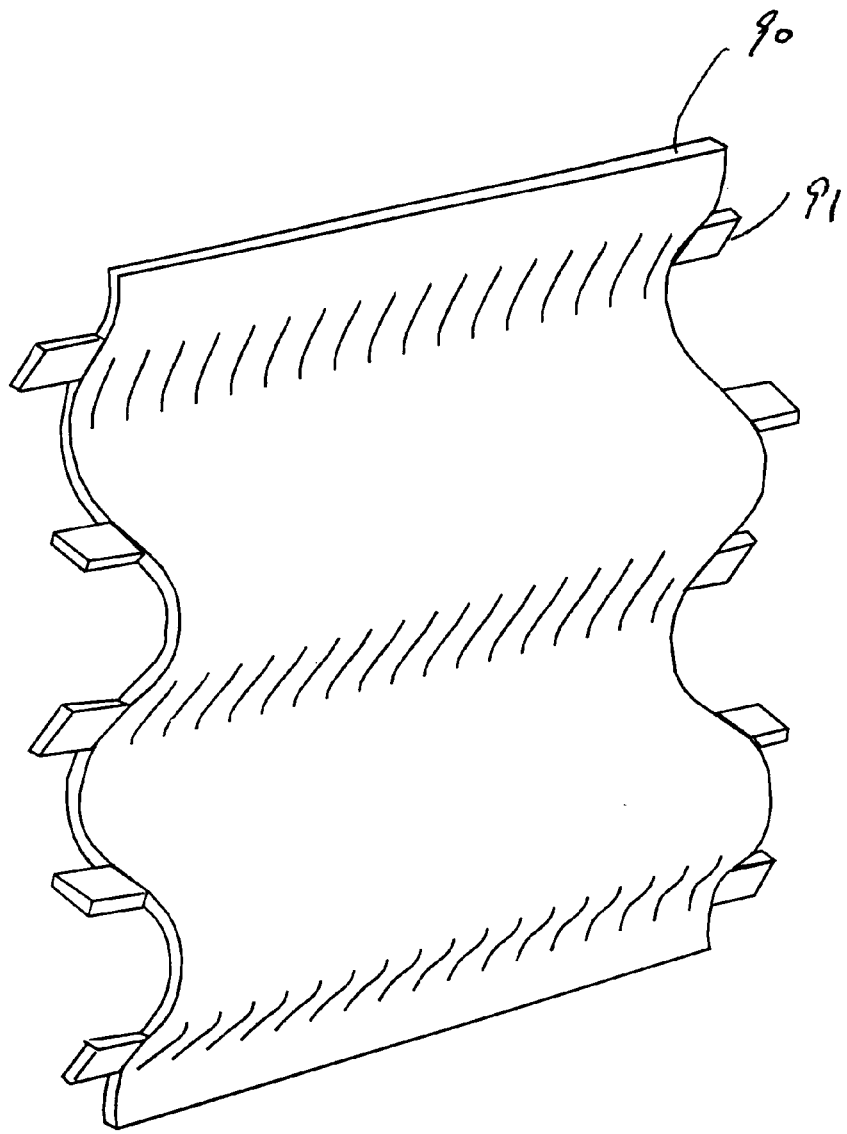
FIG. 9 is a perspective view of a cavity isolator according to another embodiment of the present invention.

FIG. 9 is a perspective view of a S cavity isolator according to another embodiment of the present invention. Specifically, FIG. 9 shows a S-shaped plate 90 with fingers 91 on opposite edges of the S-shaped plate 90, with each finger located between adjacent peaks of the curves found on the edges of the S-shaped plate 90. This particular embodiment of the present invention provides the advantage of a more secure installment of the S cavity isolator. Similar to the embodiment illustrated in FIG. 6, the fingers 91 of the S-shaped plate 90 permits the S-shaped plate 90 to slide down between two inner walls without resistance. However, removal of the S-shaped plate 90 will be met with resistance force as the top edges of the fingers 91 resiliently oppose any upward motion of the S-shaped plate 90. Hence, this alternative orientation of the fingers 91 further ensures that the S-shaped plate 90 is securely installed between two open ended inner walls, and helps prevent any accidental dislodging of the S-shaped plate 90.

Preferred embodiments of the present invention lend themselves to modular tooling. Specifically, a set of stamping dies defining a single finger arrangement could be used repeatedly to produce multi-finger configurations. Similarly, a set of stamping dies defining a single curve could be used to produce a multi-curved configuration. The general configuration also lends itself to simple tooling. In particular, a specific design could be manufactured with two operations, both of which may be incorporated in a single stamping operation. For instance, a first operation may include cutting the basic shape of the plate while the second operation may include stamping the plate into a desired S shape.

It should be noted that in preferred embodiments of the present invention, the numbers of curves and fingers may be changed and adjusted according to the desired application and design. Additional embodiments of the present invention not shown, but are obvious variations of the illustrated embodiments, are considered to be within the scope of the present invention.

What I claim:

1. In an environment of electrical equipment having first and second cavities, a cavity isolator comprising:

a S-shaped plate having first and second major surfaces generally facing said first and second cavities, respectfully; and a plurality of fingers located on opposite edges of the S-shaped plate.

2. The cavity isolator according to claim 1, wherein each of said plurality of fingers includes a dimpling.

3. The cavity isolator according to claim 1, further comprising a lead element.

4. A method of isolating two cavities within an electrical equipment comprising:

providing a S-shaped plate, said S-shaped plate having a length direction, a width direction and a thickness and fingers on opposite side edges; and installing said S-shaped plate between two open ended inner walls by providing a force in a direction generally parallel to the length direction of the plate.

5. The method of claim 4, further comprising providing a lid to enclose the electrical equipment.

6. The method of claim 5, wherein providing a force comprises pushing said lid against a top edge of the S-shaped plate such that said edge is aligned with the top edges of said open ended inner walls.

7. A RF amplifier comprising:

first and second cavities including electronic components; and a cavity isolator and a plurality of fingers located on opposite sides of the cavity isolator, wherein said cavity isolator is a S-shaped plate having first and second major surfaces generally facing said first and second cavities, respectfully.

8. The RF amplifier according to claim 7, wherein each of said plurality of fingers includes a dimpling.

9. The RF amplifier according to claim 7, wherein said cavity isolator includes a lead element.

10. In a environment of electrical equipment having a plurality of cavities, a cavity isolator comprising:

a S-shaped plate configured such that the plate forms a wall between the cavities; and a plurality of fingers located on opposite edges of the S-shaped plate, wherein said fingers extend beyond the edges of said S-shaped plate in a substantially perpendicular manner.

11. The cavity isolator according to claim 10, wherein each of said plurality of fingers includes a dimpling.

12. An electrical equipment assembly comprising:

first and second cavities each having electrical components, and a cavity isolator comprising:

a S-shaped plate having first and second major surfaces generally facing said first and second cavities; and a plurality of fingers located on opposite edges of the S-shaped plate, wherein said fingers are located between adjacent peaks of said the edges of said S-shaped plate.

13. The cavity isolator according to claim 12, wherein each of said plurality of fingers includes a dimpling.

14. In a environment of electrical equipment having a plurality of cavities, a cavity isolator comprising:

a S-shaped plate having first and second major surfaces;

a plurality of fingers located on opposite edges of the S-shaped plate;

an electromagnetic filter located on said S-shaped plate; and an electrical conductive wire, said wire configured in a bore extending between both surfaces of said S-shaped plate.

15. The cavity isolator according to claim 14, wherein each of said plurality of said fingers includes a dimpling.

* * * * *